(12) United States Patent
Ibbetson et al.

(10) Patent No.: US 7,977,686 B2
(45) Date of Patent: Jul. 12, 2011

(54) CHIP-SCALE METHODS FOR PACKAGING LIGHT EMITTING DEVICES AND CHIP-SCALE PACKAGED LIGHT EMITTING DEVICES

(75) Inventors: James Ibbetson, Santa Barbara, CA (US); Bernd Keller, Santa Barbara, CA (US); Primit Parikh, Goleta, CA (US)

(73) Assignee: Cree, Inc., Durham, NC (US)

( * ) Notice: Subject to any disclaimer, the term of this patent is extended or adjusted under 35 U.S.C. 154(b) by 95 days.

(21) Appl. No.: 12/027,313

(22) Filed: Feb. 7, 2008

(65) Prior Publication Data

US 2008/0142817 A1  Jun. 19, 2008

Related U.S. Application Data

(62) Division of application No. 11/171,893, filed on Jun. 30, 2005, now Pat. No. 7,329,905.

(60) Provisional application No. 60/584,187, filed on Jun. 30, 2004.

(51) Int. Cl.
*H01L 29/18* (2006.01)
*H01L 33/00* (2006.01)

(52) U.S. Cl. .............. 257/88; 257/96; 257/99; 257/100; 257/E33.057; 257/E33.058; 257/E33.059

(58) Field of Classification Search ............ 257/98–100, 257/E33.058, E33.059, E33.061, E33.066, 257/88; 362/614, 632, 612; 438/26
See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter, Jr. | |
| 5,338,944 A | 8/1994 | Edmond et al. | |
| 5,393,993 A | 2/1995 | Edmond et al. | |
| 5,416,342 A | 5/1995 | Edmond et al. | |

(Continued)

FOREIGN PATENT DOCUMENTS

EP 0 704 947 4/1996

(Continued)

OTHER PUBLICATIONS

Negley "Etching of Substrates of Light Emitting Diodes" U.S. Appl. No. 10/811,350, filed Mar. 26, 2004.

(Continued)

*Primary Examiner* — Minh-Loan T Tran
*Assistant Examiner* — Leslie Pilar Cruz
(74) *Attorney, Agent, or Firm* — Myers Bigel Sibley & Sajovec

(57) ABSTRACT

A packaged light emitting device includes a carrier substrate having a top surface and a bottom surface, first and second conductive vias extending from the top surface of the substrate to the bottom surface of the substrate, and a bond pad on the top surface of the substrate in electrical contact with the first conductive via. A diode having first and second electrodes is mounted on the bond pad with the first electrode is in electrical contact with the bond pad. A passivation layer is formed on the diode, exposing the second electrode of the diode. A conductive trace is formed on the top surface of the carrier substrate in electrical contact with the second conductive via and the second electrode. The conductive trace is on and extends across the passivation layer to contact the second electrode.

8 Claims, 9 Drawing Sheets

U.S. PATENT DOCUMENTS

| | | | |
|---|---|---|---|
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond |
| 5,825,047 | A | 10/1998 | Ajisawa et al. |
| 5,912,477 | A | 6/1999 | Negley |
| 5,939,732 | A * | 8/1999 | Kurtz et al. ............... 257/77 |
| 5,998,925 | A | 12/1999 | Shimizu |
| 6,071,795 | A | 6/2000 | Cheung et al. |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,420,199 | B1 | 7/2002 | Coman et al. |
| 6,531,328 | B1 | 3/2003 | Chen |
| 6,559,075 | B1 | 5/2003 | Kelly et al. |
| 6,733,711 | B2 * | 5/2004 | Durocher et al. ........ 264/272.14 |
| 6,740,906 | B2 | 5/2004 | Slater, Jr. et al. |
| 6,747,298 | B2 | 6/2004 | Slater, Jr. et al. |
| 6,800,500 | B2 | 10/2004 | Coman et al. |
| 6,879,014 | B2 * | 4/2005 | Wagner et al. ............... 257/458 |
| 2002/0001192 | A1 * | 1/2002 | Suehiro et al. ............... 362/240 |
| 2002/0068201 | A1 | 6/2002 | Vaudo et al. |
| 2002/0105266 | A1 | 8/2002 | Juestel et al. |
| 2002/0190262 | A1 | 12/2002 | Nitta et al. |
| 2003/0006418 | A1 | 1/2003 | Emerson et al. |
| 2003/0013217 | A1 | 1/2003 | Dudoff et al. |
| 2003/0042507 | A1 | 3/2003 | Slater et al. |
| 2003/0045015 | A1 | 3/2003 | Slater et al. |
| 2003/0123164 | A1 | 7/2003 | Hsu et al. |
| 2004/0041222 | A1 | 3/2004 | Loh |
| 2004/0051111 | A1 | 3/2004 | Ota et al. |
| 2004/0079957 | A1 | 4/2004 | Andrews et al. |
| 2004/0080938 | A1 | 4/2004 | Holman et al. |
| 2004/0119086 | A1 | 6/2004 | Yano et al. |
| 2004/0169189 | A1 * | 9/2004 | Jeon ............... 257/98 |
| 2004/0203189 | A1 * | 10/2004 | Chen et al. ............... 438/108 |
| 2004/0217361 | A1 | 11/2004 | Negley |
| 2004/0217630 | A1 | 11/2004 | Takeuchi et al. |
| 2004/0222433 | A1 * | 11/2004 | Mazzochette et al. .......... 257/99 |
| 2004/0251469 | A1 | 12/2004 | Yatsuda et al. |
| 2005/0051789 | A1 * | 3/2005 | Negley et al. ............... 257/99 |

FOREIGN PATENT DOCUMENTS

| | | |
|---|---|---|
| EP | 1 408 559 | 4/2004 |
| WO | WO 2004/010509 | 1/2004 |
| WO | WO 2004/088760 | 10/2004 |
| WO | WO 2004/100343 | 11/2004 |

OTHER PUBLICATIONS

Slater et al. "Methods of Processing Semiconductor Wafer Backsides Having Light Emitting Devices (LEDs) Theron and LEDs So Formed" U.S. Appl. No. 10/987,135, filed Nov. 12, 2004.

Keller et al. "Semiconductor Light Emitting Devices and Submounts and methods for Forming the Same" U.S. Appl. No. 10/987,894, filed Nov. 12, 2004.

International Search Report and Written Opinion of the International Searching Authority for Patent Application No. PCT/US2005-023755 mailed on May 11, 2006.

* cited by examiner

CHIP-SCALE METHODS FOR PACKAGING LIGHT EMITTING DEVICES AND CHIP-SCALE PACKAGED LIGHT EMITTING DEVICES

CROSS-REFERENCE TO RELATED APPLICATION

This application is a divisional of and claims priority to U.S. patent application Ser. No. 11/171,893, entitled Chip-Scale Methods for Packaging Light Emitting Devices and Chip-Scale Packaged Light Emitting Devices, filed on Jun. 30, 2005 now U.S. Pat. No. 7,329,905 and claims the benefit of Provisional Application No. 60/584,187 filed Jun. 30, 2004, entitled, "Chip Scale Packaging of Light Emitting Devices and Packaged Light Emitting Devices", the disclosure of which is incorporated herein by reference in its entirety as if set forth fully herein.

FIELD OF THE INVENTION

The present invention relates to semiconductor devices, and more particularly to packaged light emitting devices and methods of packaging of light emitting devices.

BACKGROUND

Light emitting diodes and laser diodes are well known solid state electronic devices capable of generating light upon application of a sufficient voltage. Light emitting diodes and laser diodes may be generally referred to as light emitting devices (LEDs). Light emitting devices generally include a p-n junction formed in an epitaxial layer grown on a substrate such as sapphire, silicon, silicon carbide, gallium arsenide and the like. The wavelength distribution of the light generated by the LED depends on the material from which the p-n junction is fabricated and the structure of the thin epitaxial layers that include the active region of the device.

Typically, an LED includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer).

In order to use an LED in a circuit, it is desirable to package the LED to protect it from environmental harm and mechanical damage. An LED package also includes means, such as electrical leads, for electrically connecting the LED chip to an external circuit. In a typical package 70 illustrated in FIG. 1A, an LED 72 is mounted on a reflective cup 73 by means of a solder bond or epoxy. One or more wirebonds connect the ohmic contacts of the LED to leads 75A, 75B which may be attached to or integral with the reflective cup 73. The entire assembly is then encapsulated in a clear protective resin 74 which may be molded in the shape of a lens to collimate the light emitted from the LED chip 72.

In another conventional package 80 illustrated in FIG. 1B, a plurality of LED chips 82 are mounted onto a printed circuit board (PCB) carrier 83. One or more wirebond connections are made between ohmic contacts on the LEDs 82 and electrical traces 85A, 85B on the PCB 83. Each mounted LED 82 is then covered with a drop of clear resin 84 which may provide environmental and mechanical protection to the chip while also acting as a lens. The individual packaged LEDs 82 are then separated by sawing the PCB board 83 into small squares, each of which contains one or more LED chips 82.

One drawback to these methods of packaging an LED chip may be that the chips are mounted on the carriers one at a time. That is, each LED is individually mounted onto the PCB or a reflector cup. In addition, wirebond connections are typically made to each LED chip. These operations may be costly, time-consuming and may require substantial amounts of manual labor and/or specialized equipment. Problems with wirebond connections may also account for device failures in the field. Moreover, alignment and placement problems associated with mounting the LED chips may result in undesirable variations in optical characteristics of the resulting packaged chips.

One figure of merit for users of light emitting devices is cost per lumen, that is, the cost of obtaining a given level of light output. The high cost of conventional packaging techniques may be one factor that keeps the cost per lumen of solid state lighting relatively high. In addition, conventional packaging techniques may result in large, bulky packages that are unsuitable for certain miniaturized applications such as cellular telephone backlights. Conventional packaging techniques may also have poor thermal resistance characteristics that limit the power levels at which the LED chip may be driven and place constraints on system designers with respect to placement of LEDs.

SUMMARY

According to some embodiments of the invention, a packaged light emitting device includes a carrier substrate having a top surface and a bottom surface, first and second conductive vias extending from the top surface of the substrate to the bottom surface of the substrate, and a bond pad on the top surface of the substrate in electrical contact with the first conductive via. A diode having first and second electrodes is mounted on the bond pad with the first electrode is in electrical contact with the bond pad. A passivation layer is formed on the diode, exposing the second electrode of the diode. A conductive trace is formed on the top surface of the carrier substrate in electrical contact with the second conductive via and the second electrode. The conductive trace is on and extends across the passivation layer to contact the second electrode.

In some embodiments, the passivation layer may be partially or completely removed after the conductive trace is formed, leaving a so-called air bridge connection between the second electrode and the second conductive via.

In some embodiments, the passivation layer covers a portion of the carrier substrate. In further embodiments, the passivation layer further covers a portion of the bond pad.

In some embodiments, a reflective layer is formed on the carrier substrate surrounding the diode, to reflect light emitted by the diode in a desired direction. The reflective layer, which may cover portions of the passivation layer and the conductive trace may define a cavity above the diode which may be filled with an encapsulant material. The encapsulant material may include a wavelength conversion material such as a wavelength conversion phosphor. In some embodiments, the encapsulant material may be engineered to have a high refractive index using, for example, a composite of nanoparticles and epoxy resin or silicone. In some embodiments, the index of refraction of the encapsulant material may be about 1.6 or more. In some embodiments, a wavelength conversion material may be coated on a surface of the diode.

In some embodiments, a packaged light emitting device may further include a sealing layer on the reflective layer that forms a hermetic seal above the diode for environmental and mechanical protection.

In some embodiments, the diode includes a growth substrate and an epitaxial structure on the growth substrate. In some embodiments, the growth substrate has a thickness less than about 150 µm. In further embodiments, the diode includes an epitaxial structure from which a growth substrate has been removed.

Some method embodiments according to the invention include providing an epiwafer including a growth substrate and an epitaxial structure on the growth substrate, bonding a carrier substrate to the epitaxial structure of the epiwafer, forming a plurality of conductive vias through the carrier substrate, defining a plurality of isolated diodes in the epitaxial structure, and electrically connecting at least one conductive via to respective ones of the plurality of isolated diodes. Methods according to embodiments of the invention may further include encapsulating at least one of the isolated diodes with an encapsulant and separating the encapsulated diode into an individual packaged device.

In some embodiments, bonding the carrier substrate to the epitaxial structure is followed by removing the growth substrate from the epitaxial structure.

In some embodiments, methods according to the invention include thinning the growth substrate to a thickness of less than about 150 µm.

In some embodiments, forming a plurality of conductive vias through the carrier substrate includes forming at least a pair of vias through the carrier substrate for each isolated diode. In some embodiments, the carrier substrate itself may be formed from a conductive material and may thereby serve to act as one of the pair of conductive vias for each isolated diode. The remaining conductive via may be electrically isolated from the carrier substrate. In some embodiments, additional circuitry and/or circuit elements may be added to the carrier wafer to aid the light emitting diode operation. Such circuitry and/or elements may include a Zener diode for electrostatic discharge protection, electronic driver circuitry to regulate the voltage or current during diode operation, and/or digital circuitry to aid addressing the LED in certain applications.

In further embodiments, encapsulating at least one of the plurality of diodes with an encapsulant includes encapsulating a diode with an encapsulant material including a wavelength conversion material, such as a phosphor.

In some embodiments, defining a plurality of isolated diodes in the epitaxial structure includes forming a plurality of mesa structures in the epitaxial structure, for example by selectively etching the epitaxial structure. Selectively etching the epitaxial structure to form a plurality of mesas may be performed before bonding the carrier substrate to the epitaxial structure. In some embodiments, selectively etching the epitaxial structure to form a plurality of mesas is performed after bonding the epitaxial structure to the carrier substrate and removing the growth substrate.

In some embodiments, defining a plurality of isolated diodes in the epitaxial structure precedes bonding the epitaxial structure to the carrier substrate. In further embodiments, removing the growth substrate precedes defining a plurality of isolated diodes in the epitaxial structure.

In some embodiments, bonding the carrier substrate to the epitaxial structure is preceded by forming a plurality of bond pads on the carrier substrate, wherein each of the isolated diodes is bonded to at least one of the bond pads. Each of the conductive vias may be in electrical contact with at least one of the bond pads.

In further embodiments, methods include forming a plurality of bond pads on a side of the carrier substrate opposite a side of the carrier substrate on which the plurality of diodes are bonded such that each bond pad is in electrical contact with at least one of the conductive vias.

Some embodiments of the invention include forming a passivation layer on at least one diode such that the passivation layer exposes an electrode on the diode. A plurality of conductive traces may be formed on a side of the carrier substrate on which the diodes are bonded. Some of the conductive traces may electrically connect a top surface of a diode to a conductive via.

In some embodiments, methods according to the invention include forming a reflective layer on the upper surface of the carrier substrate, the reflective layer defining a cavity above a diode. An encapsulating material, which may include a wavelength conversion material, may be deposited in the cavity. Additionally, the cavity may be covered with a sealing member that may form a hermetic seal over the cavity.

In some embodiments of the invention, at least two isolated diodes may be covered with a transparent resin. In some embodiments, separating the isolated diodes into packaged devices includes forming a packaged device having at least two diodes therein.

Some embodiments of the invention provide a semiconductor structure having a carrier substrate having a top surface and a bottom surface, a plurality of light emitting diodes bonded to the top surface of the carrier substrate, each of the light emitting diodes having first and second electrodes, and a plurality of pairs of first and second conductive vias extending from the top surface of the carrier substrate to the bottom surface of the substrate, wherein each pair of conductive vias is electrically connected to the first and second electrodes of a light emitting diode of the plurality of light emitting diodes.

In some embodiments, the semiconductor structure further includes a plurality of bond pads disposed between the top surface of the carrier substrate and the plurality of light emitting diodes, wherein at least one of the light emitting diodes is mounted on one of the bond pads.

An encapsulant material may be formed on at least one of the light emitting diodes. In some embodiments, a plurality of bond pads is formed on the bottom surface of the carrier substrate, wherein each of the plurality of bond pads on the bottom surface of the carrier substrate is in electrical contact with at least one of the first or second conductive vias.

In some embodiments, the thermal and/or electrical resistance of the package may be reduced by the formation of additional vias through the carrier substrate for each diode. Accordingly, packaged light emitting devices according to some embodiments of the invention may include at least one additional conductive via extending through the substrate.

In further embodiments, a packaged light emitting device includes a conductive carrier substrate having a top surface and a bottom surface. A conductive via extends from the top surface of the substrate to the bottom surface of the substrate. A current blocking layer is between the conductive via and the substrate. A bond pad is on the top surface of the substrate. A diode having first and second electrodes is mounted on the bond pad. The first electrode is in electrical contact with the bond pad. A conductive trace is on the top surface of the carrier substrate and is in electrical contact with the conductive via and the second electrode.

In yet further embodiments, packaged light emitting devices include a carrier substrate having a top surface and a bottom surface. First and second conductive vias extend from the top surface of the substrate to the bottom surface of the substrate. A bond pad is on the top surface of the substrate and is in electrical contact with the first conductive via. A diode having first and second electrodes is mounted on the bond pad. The first electrode is in electrical contact with the bond pad. A conductive trace is on the top surface of the carrier substrate and is in electrical contact with the second conductive via and the second electrode.

Other features, embodiments and aspects of the invention will be apparent from the detailed description and drawings.

DETAILED DESCRIPTION

Figure 1A:
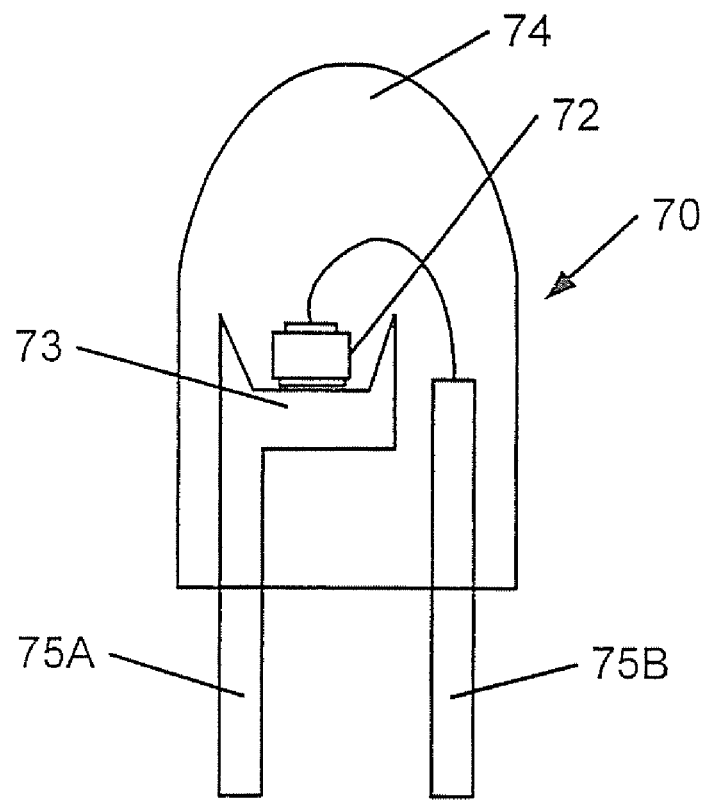
FIGS. 1A-1B illustrate conventional LED packages.
Figure 1B:
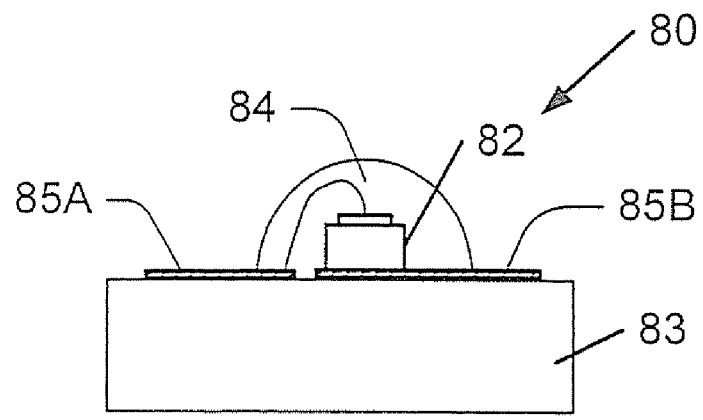

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures. In addition, certain features of the drawings such as layer thicknesses and feature sizes are illustrated in exaggerated dimensions for clarity of drawing and ease of explanation.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the figures. For example, if the device in the figures. is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. It will also be appreciated by those of skill in the art that references to a structure or feature that is disposed "adjacent" another feature may have portions that overlap or underlie the adjacent feature.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, elements or components, but do not preclude the presence or addition of one or more other features, elements or components.

Embodiments of the present invention are described herein with reference to cross-section, plan-view and/or perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded, curved or graded features at its edges rather than a discrete change from one region to the next. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Embodiments of the invention now will be described, generally with reference to gallium nitride-based light emitting diodes on silicon carbide-based substrates. However, it will be understood by those having skill in the art that many embodiments of the invention may be employed with many different combinations of substrate and epitaxial layers. For example, combinations can include AlGaInP diodes on GaP substrates; InGaAs diodes on GaAs substrates; AlGaAs diodes on GaAs substrates; SiC diode on SiC or sapphire (Al$_2$O$_3$) substrate; and/or a nitride-based diodes on gallium nitride, silicon carbide, aluminum nitride, sapphire, silicon, zinc oxide and/or other substrates.

GaN-based light emitting devices typically include an insulating or conductive substrate such as SiC or sapphire on which a plurality of GaN-based epitaxial layers are formed. The epitaxial layers may include an active region having a p-n junction that emits light when energized.

Although various embodiments of LEDs disclosed herein include a substrate, it will be understood by those skilled in the art that the crystalline epitaxial growth substrate on which the epitaxial layers including an LED are grown may be removed, and the freestanding epitaxial layers may be mounted on a substitute carrier substrate or submount which may have better thermal, electrical, structural and/or optical characteristics than the original substrate. The invention described herein is not limited to structures having crystalline epitaxial growth substrates and may be utilized in connection with structures in which the epitaxial layers have been removed from their original growth substrates and bonded to substitute carrier substrates.

Light emitting devices for use in embodiments of the present invention may be gallium nitride based light emitting diodes or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,740,906, 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in United States Patent Publication No. 2003/0006418, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES," the disclosure of which is incorporated herein as if set forth fully.

In some embodiments of the invention, the light emitting devices may include a p-electrode that provides a reflecting layer to reflect light generated in the active region back through the device. Reflective p-electrodes and related structures are described in U.S. Patent Publication No. 2003/0123164 entitled "LIGHT EMITTING DIODES INCLUDING SUBSTRATE MODIFICATIONS FOR LIGHT EXTRACTION AND MANUFACTURING METHODS THEREFOR" the disclosure of which is hereby incorporated by reference as if set forth fully herein.

Figure 2A:
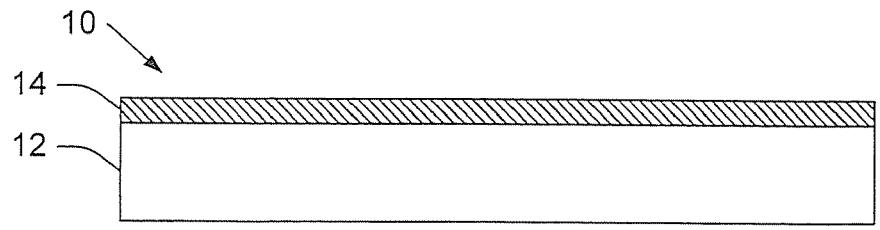
FIGS. 2A-2H are cross-sectional drawings illustrating some embodiments of the invention.

Referring now to the embodiments of FIG. 2A, methods of packaging LEDs according to some embodiments of the invention employ an epiwafer 10 having a substrate 12 and an epitaxial growth layer 14. As discussed above, the substrate 12 may be a silicon carbide single crystal of the 4H or 6H polytype. The epitaxial growth layer 14 may include p- and n-type layers (not shown) which form a p-n junction diode structure, an isotype heterostructure diode structure, or other diode structure. In general, the n-type layers may be formed directly on the substrate 12, while the p-type layers are formed on the n-type layers. In some embodiments, the epitaxial layers include one or more Group III-nitride semiconductor material such as GaN, AlGaN, and/or InGaN. Thus, the epitaxial growth layer 14 may include multiple layers, all commonly referred to as the epitaxial layer 14.

Figure 2B:
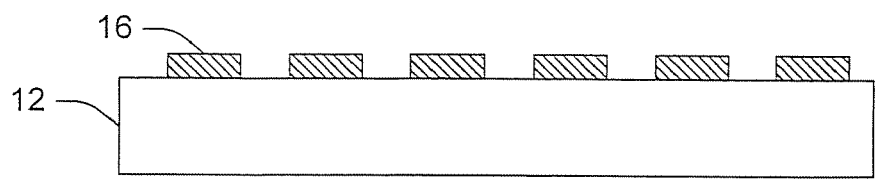

The epiwafer 10 may be masked, patterned and etched using conventional wet and/or dry etch techniques to form a plurality of diodes 16, each of which may include a p-n junction light emitting diode as illustrated in FIG. 2B. It will be understood by those skilled in the art that the diodes 16 may include light emitting diodes, superluminescent diodes, laser diodes and/or any other solid state light emitting devices.

Figure 2C:
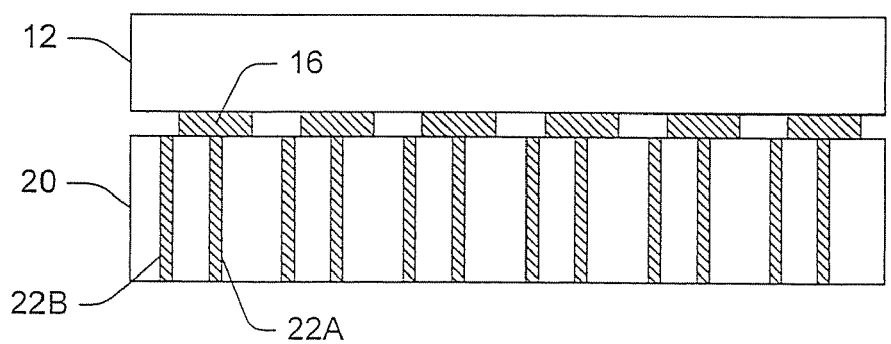

Referring to the embodiments of FIG. 2C, the epiwafer 10 may then be wafer-bonded upside-down (i.e. epitaxial side down in flip-chip fashion) to a carrier substrate 20 which may include Si, SiC, GaAs, AlN or any other suitable substrate. In particular, carrier substrate 20 may be a semiconductor wafer, or a wafer of insulating or semi-insulating material. In some embodiments, carrier substrate 20 is insulating and has high thermal conductivity. Carrier substrate 20 may include a plurality of conductive vias 22A, 22B therethrough. As will be discussed in more detail below, the vias 22A, 22B may be used to make electrical contact to electrodes of the diodes 16, for example the anode (positive) and cathode (negative) contacts of the diodes 16. The vias 22A, 22B may be formed as through-holes in the carrier substrate 20 which are filled and/or plated with conductive material, such as metal. At least one via 22A may be in electrical contact with a surface of each diode 16, thereby forming an anode or cathode contact to the diode 16. An adjacent via 22B may be coupled to an opposite surface of the diode 16 by means of a metallization (not shown) to thereby form the opposite (cathode or anode) connection to the diode 16. Interconnection of the vias 22A, 22B with the diode 16 is described in more detail below. Vias 22A, 22B may be formed in the carrier substrate 20 before or after bonding of the epiwafer 10.

Figure 2D:
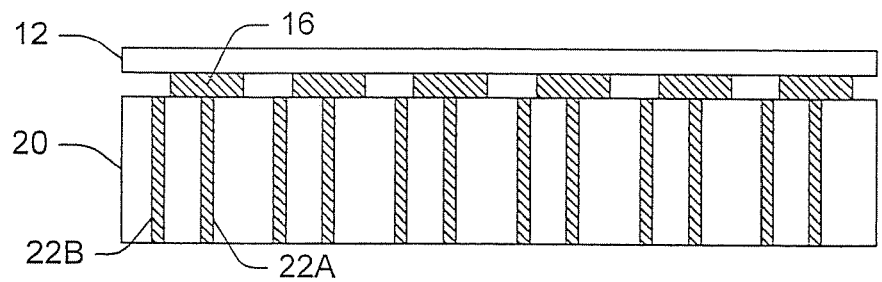

As illustrated in FIG. 2D, the substrate 12 may be thinned, for example, by etching, mechanical lapping or grinding and polishing, to reduce the overall thickness of the structure. In particular, the substrate 12 may be thinned to a thickness of less than 150 microns. Thinning the substrate 12 may also reduce the forward voltage (Vf) required to operate the diode 16. Techniques for thinning the substrate 12 are described in U.S. patent application Ser. No. 10/987,135 entitled "Methods of Processing Semiconductor Wafer Backsides Having Light Emitting Devices (LEDs) Thereon and LEDs So Formed" filed Nov. 12, 2004, the disclosure of which is hereby incorporated by reference as if set forth fully herein. Furthermore, the substrate 12 may be shaped or roughened using sawing, laser scribing or other techniques to introduce geometrical features such as angled sidewalls which may increase light extraction. The substrate 12 may be etched to improve light extraction using for example the etch process described in U.S. patent application Ser. No. 10/811,350 entitled "ETCHING OF SUBSTRATES OF LIGHT EMITTING DIODES" filed Mar. 26, 2004, the disclosure of which is hereby incorporated by reference as if set forth fully herein.

Figure 2E:
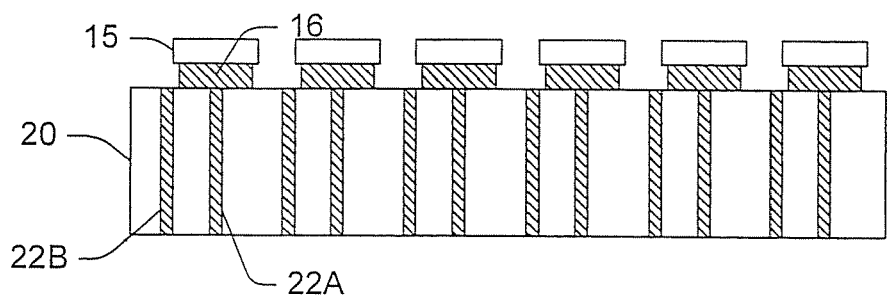
Figure 2F:
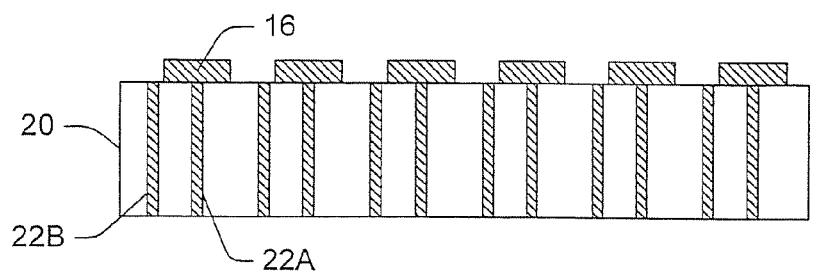

Portions of the substrate 12 may then be selectively removed, by etching and/or sawing for example, to isolate each individual diode 16 as shown in FIG. 2E. Alternatively, as shown in FIG. 2F, the substrate may be remove entirely by substrate removal techniques such as the techniques taught in U.S. Pat. Nos. 6,559,075, 6,071,795, 6,800,500 and/or 6,420,199 and/or U.S. Patent Publication No. 2002/0068201, the disclosures of which are hereby incorporated by reference as if set forth fully herein.

Once the diodes 16 have been isolated on the carrier substrate 20 (with or without portions of substrate 12 attached), the individual diodes 16 may be coated with an optional wavelength conversion layer 25. The wavelength conversion layer 25 may include a wavelength conversion phosphor such as one or more of the phosphors described in U.S. Pat. No. 5,998,925, U.S. Patent Publication 2002/0105266 and/or U.S. Patent Publication No. 2004/0051111 for down-converting light emitted by the diode 16 into a lower frequency (higher wavelength) light. As is known in the art, unconverted light emitted by the diode 16 may combine with converted light emitted by the conversion layer 25 to form light which is perceived as a third color. For example, blue light emitted by the diode 16 may combine with yellow light emitted by the conversion layer 25 to form light which may be perceived by an observer as white or near-white in color.

Figure 2G:
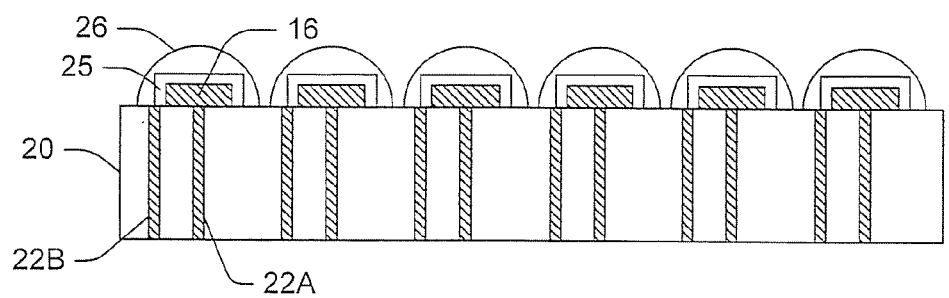
Figure 2H:
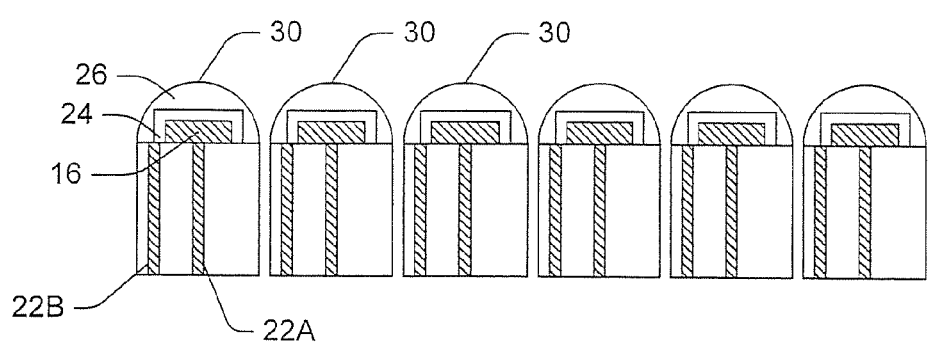
Figure 3A:
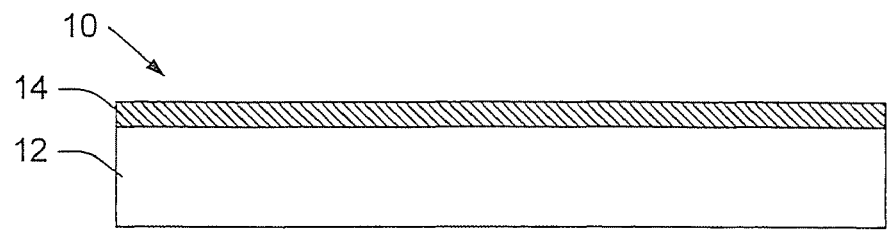
FIGS. 3A-3D are cross-sectional drawings illustrating further embodiments of the invention.
Figure 3B:
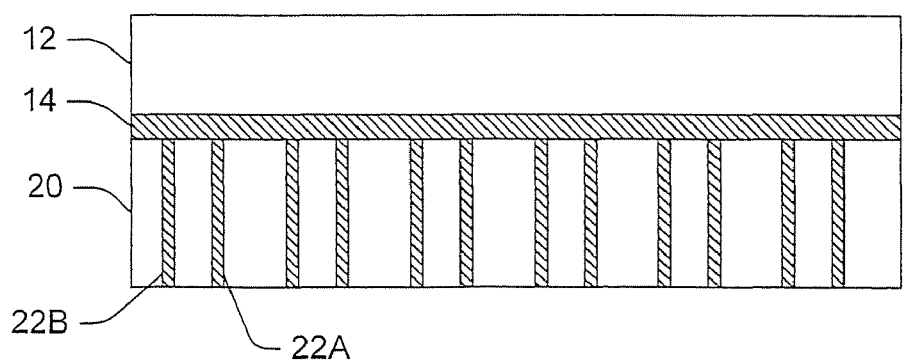
Figure 3C:
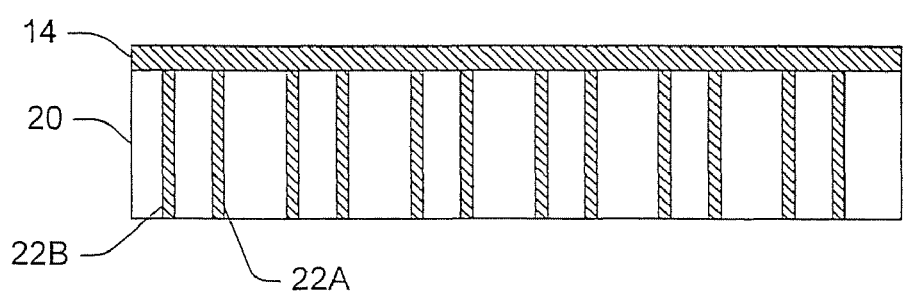
Figure 3D:
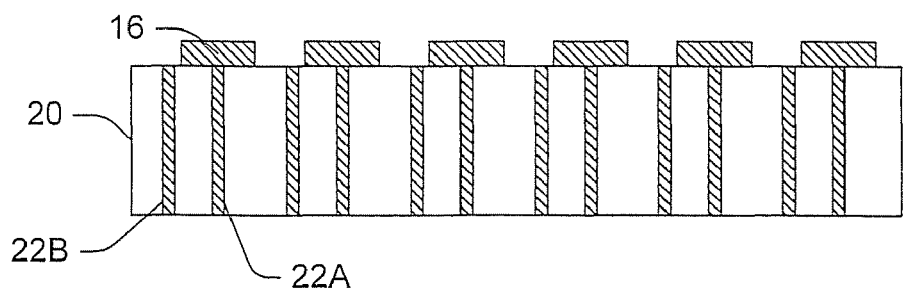

As shown in FIG. 2G, a drop of an encapsulant material 26 such as a clear epoxy may be placed over each diode 16. The encapsulant material 26 may provide mechanical and environmental protection to the diode 16 and may also function as a lens. By using a composite encapsulant material whose refractive index is about 1.6 or higher, for example a composite encapsulant material including high index nanoparticles, the efficiency of the diode may be improved. As illustrated in FIG. 2H, the carrier substrate 20 is then diced (e.g. by sawing) to form individual packaged devices 30 which are ready to be mounted in a circuit or system.

Contact to the packaged devices 30 is made by connection to bond pads (not shown) on the bottom surface of the carrier substrate coupled to the vias 22A, 22B. Thus, the packaged device may be attached directly to a circuit board or other carrier by solder bonding, epoxy bonding or other methods. Since device separation occurs last, most of the package processing is done at the wafer level, which may substantially decrease the overall cost of packaging the device. Reducing the packaging cost per die may in turn decrease the cost per lumen of light output by the packaged parts. In addition, the resulting packaged device may be relatively small which permits placement of the packaged device in a smaller footprint compared to a conventional package and results in conservation of space on a PCB. By providing a smaller, chip-scale package, secondary optics (e.g. other lenses or reflectors in the system) may also be made more compact and affordable.

Light extraction from a package according to some embodiments of the invention may be as good or better than light extraction from conventional packages. In particular, light extraction from packages according to some embodiments of the invention may be increased by forming light extraction features on various surfaces on or within the package such as unbonded surfaces of the diode 16 and/or unbonded surfaces of the carrier substrate 20. Light extraction features on the surface of the diode 16 may include, for example, surface roughness, beveled surfaces, pyramid- or cone-shaped features and the like which reduce total internal reflection at the surface of the device. The unbonded surfaces of the carrier substrate 20 may be coated with a reflective layer and/or may be textured. In addition, light scattering agents, including high refractive index materials, may be added to the encapsulant material 26, and the surface of the encapsulant material 26 may be roughened or faceted to improve light extraction.

The thermal resistance of a package according to some embodiments of the present invention may be lower than that of conventional packages due to the wafer bond connection between the diode 16 and the carrier substrate 20. In particular, the thermal resistance of the package may be low where the carrier wafer includes a material with high thermal conductivity such as SiC or AlN. Alternatively, the thermal and/or electrical resistance of the package may be made even lower by the formation of additional vias through the carrier substrate for each diode 16.

Further embodiments of the invention are illustrated in FIGS. 3A-3D. As illustrated therein, an epiwafer 10 including a substrate 12 and an epitaxial layer 14 may be wafer bonded to a carrier substrate 20 without first patterning and etching the epitaxial layer 14 to define individual diodes therein. The substrate 12 may then be removed using conventional lift-off techniques referenced above. The resulting epitaxial layer 14, which is wafer bonded to the carrier substrate 20, may then be etched to form mesas which define individual diodes 16. The resulting structure may then processed as described above in connection with FIGS. 2F-2H. One advantage of these embodiments may be that the epiwafer 10 does not have to be precisely aligned with bond pads on the carrier substrate 20 when it is bonded to the carrier substrate 20.

Figure 4A:
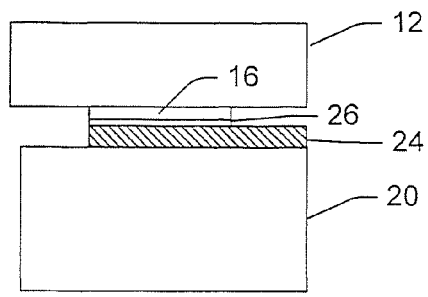
FIGS. 4A-4J are cross-sectional drawings illustrating further embodiments of the invention.
Figure 4B:
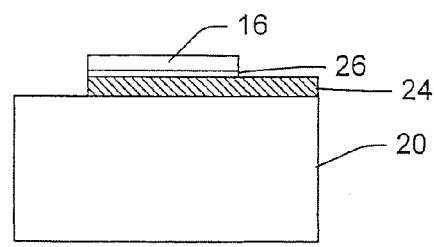
Figure 4C:
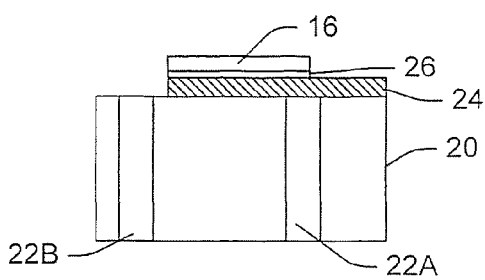
Figure 4D:
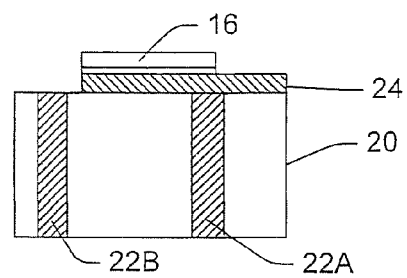
Figure 4E:
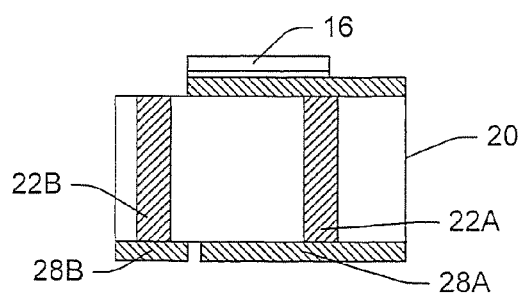
Figure 4F:
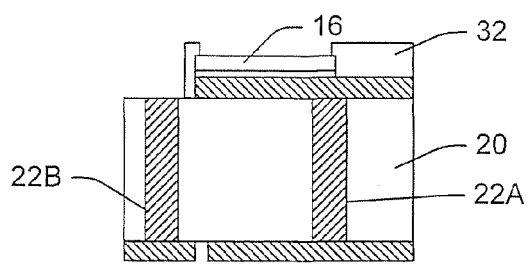

Procedures for fabricating devices according to some embodiments of the invention are shown in greater detail in FIGS. 4A-4J. For clarity, only a single diode 16 is illustrated in FIGS. 4A-4J. As illustrated in FIG. 4A, a substrate 12 on which a plurality of diodes 16 are formed is wafer bonded to a carrier substrate 20 on which a plurality of bond pads 24 are formed. A metal stack 26 on diode 16 bonds to bond pad 24. Metal stack 26 may include ohmic, barrier, reflector and/or bonding layers as described in U.S. Patent Publication No. 2003/0045015, U.S. Patent Publication No. 2003/0042507, U.S. Pat. No. 6,747,298, and/or PCT Publication No. WO04/010509, the disclosures of which are hereby incorporated by reference as if set forth fully herein. After bonding wafer 12 to the carrier substrate 20, the growth wafer 12 may be removed according to the methods referenced above. In some embodiments, wafer 12 may be thinned instead of being completely removed. Next, as illustrated in FIG. 4C, a plurality of vias 22A, 22B may be formed in the substrate 20. For each diode 16, at least one via 22B may be formed beneath each bond pad 24. The vias 22A, 22B may then be plated or filled with metal or other conducting material as shown in FIG. 4D, and bond pads 28A, 28B may be formed on the back side of substrate 20 (i.e. opposite diode 16) in electrical contact with conductive vias 22A, 22B, respectively, as shown in FIG. 4E. A passivation layer 32 may be formed on the upper surface of the substrate 20 adjacent the diode 16 and patterned to reveal at least a portion of an electrode on a surface of diode 16 and at least a portion of the via 22B as shown in FIG. 4F. Note that as formed, the vias 22A and 22B are electrically isolated from each other (and likewise bond pads 28A and 28B are isolated from each other). This isolation may be provided in a number of ways. For example, the carrier substrate may be made from an insulating or semi-insulating material. Alternatively, if the carrier substrate is an electrically conductive material, the surfaces of the carrier substrate, including the unfilled vias, may be coated with an insulating material.

Figure 4G:
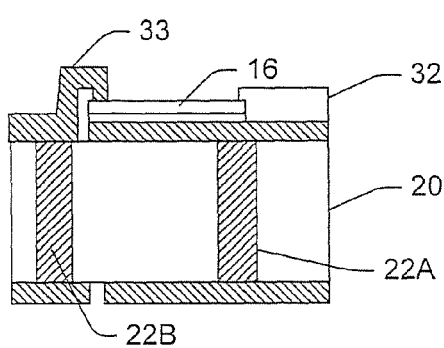
Figure 4H:
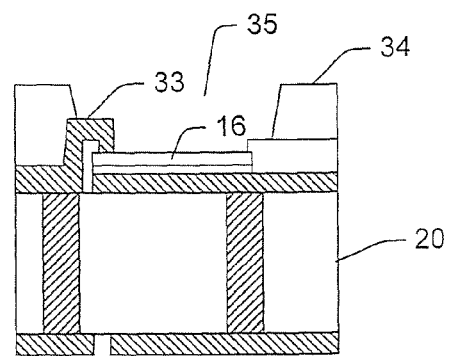
Figure 4I:
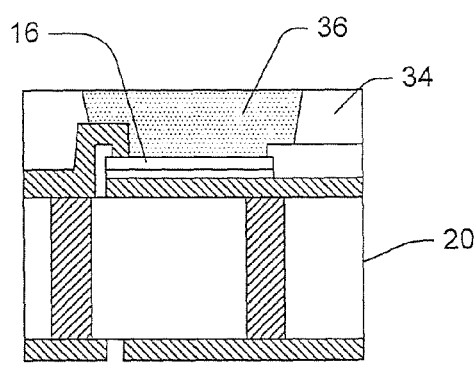
Figure 4J:
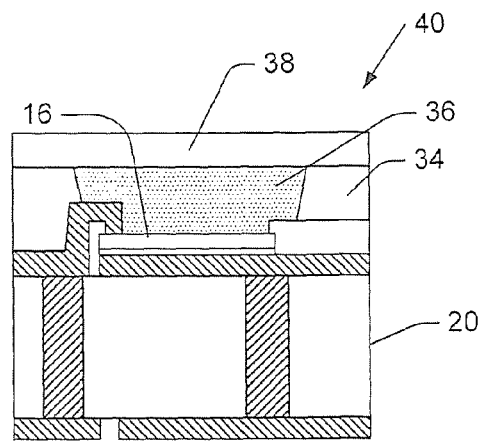

Referring to the embodiments of FIG. 4G, a metal interconnect 33 may be formed using conventional techniques (such as evaporation) to connect the conductive via 22B with the exposed electrode of diode 16. In some embodiments, an ohmic contact (not shown) may be formed on an exposed surface of diode 16 prior to interconnection with via 22B. In some embodiments, the passivation layer 32 may be partially or completely removed after the metal interconnect 33 is formed, leaving a so-called air bridge connection between the exposed surface of diode 16 and via 22B. As shown in FIG. 4H, a reflective surface 34 may be formed around each diode 16, using electroplating, for example, to reflect light emitted by the device in a desired direction. An encapsulant material 36 may then be deposited above diode 16 within a cavity 35 defined by reflective surface 34 (FIG. 4I). In some embodiments the cavity 35 defined by the reflective surface 34 may be shallow, e.g. such that it does not extend above the diode 16, but its perimeter may still serve to define the shape of the encapsulant material through the action of surface tension. In some embodiments, the encapsulant material 36 may include a wavelength conversion material as described above. Finally, as illustrated in FIG. 4J, an optional sealing layer 38 may be formed above the cavity 35. The sealing layer 38, which may include $SiO_2$, may form a hermetic seal over the cavity 35 to provide additional protection for the diode 16. The completed packaged devices may then be separated to provide individual packaged devices.

Figure 5A:
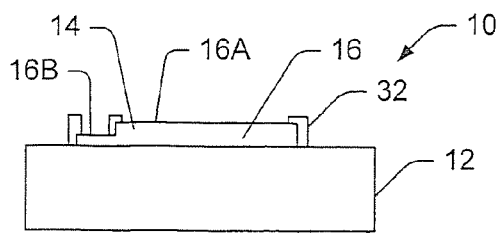
FIGS. 5A-5I are cross-sectional drawings illustrating further embodiments of the invention.
Figure 5B:
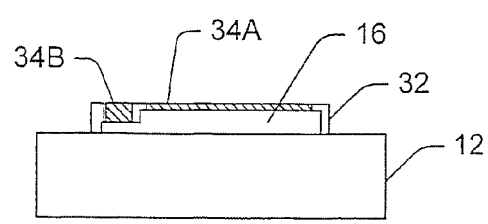

Methods of fabricating packaged devices according to further embodiments the invention are shown in FIGS. 5A-5I. Referring to the embodiments of FIG. 5A, an epiwafer 10 including a substrate 12 and an epitaxial layer 14 may be etched to form a plurality of diodes 16. For clarity, only a single diode 16 is illustrated in FIGS. 5A-5L. The top layer 16A of each diode 16 has a conductivity type (p or n). A portion of each diode 16 is further etched to reveal a contact layer 16B having a conductivity type opposite the conductivity type of the top layer 16A. Passivation layer 32 may be applied to the structure and patterned to isolate the edges of diode 16, and also to isolate top layer 16A from contact layer 16B. Metal stacks 34A and 34B may then formed on top layer 16A and contact layer 16B respectively as illustrated in FIG. 5B. Metal stacks 34A and 34B may include ohmic, barrier, reflector and/or bonding layers as described above.

Figure 5C:
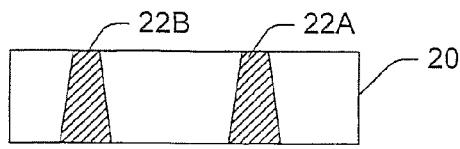
Figure 5D:
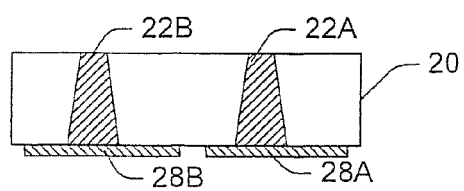
Figure 5E:
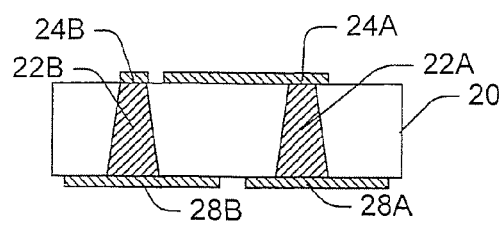
Figure 5F:
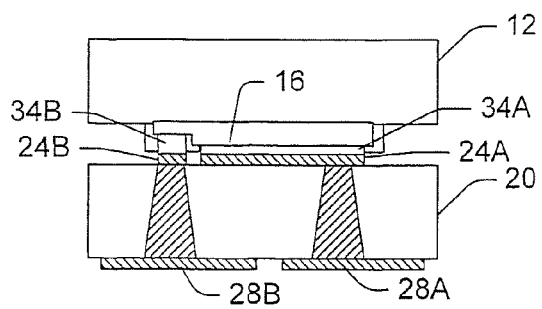

Referring to the embodiments of FIGS. 5C-5E, a carrier substrate 20 is provided. Carrier substrate 20 may include SiC, AlN, GaAs, Si, or any other suitable substrate material. In some embodiments, carrier substrate 20 is insulating and has high thermal conductivity. Vias 22A, 22B may be etched through carrier substrate 20 and plated or filled with metal or another conductive material. Backside traces 28A, 28B may be formed on the bottom of carrier substrate 20 while bond pads 24A, 24B may be formed on the top surface of carrier substrate as illustrated in FIGS. 5D-E. Traces 28A, 28B may be used to mount the finished device on a PCB, for example, while bond pads 24A, 24B may be used to bond to metal stacks 34A, 34B, respectively, of a diode 16 as shown in FIG. 5F.

Figure 5G:
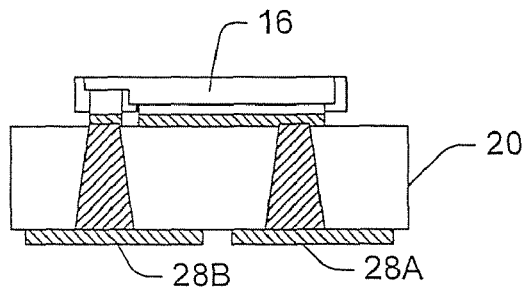

Referring to the embodiments of FIG. 5G, after bonding of the epiwafer 10 to carrier substrate 20, substrate 12 may be removed, leaving individual diodes 16 bonded to carrier substrate 20. Alternatively, substrate 12 may be thinned but not completely removed. Substrate 12 may be thinned before or after wafer bonding to carrier substrate 20.

Figure 5H:
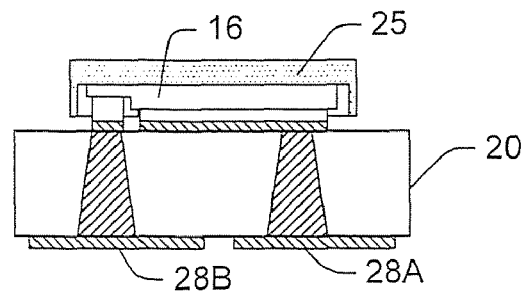
Figure 5I:
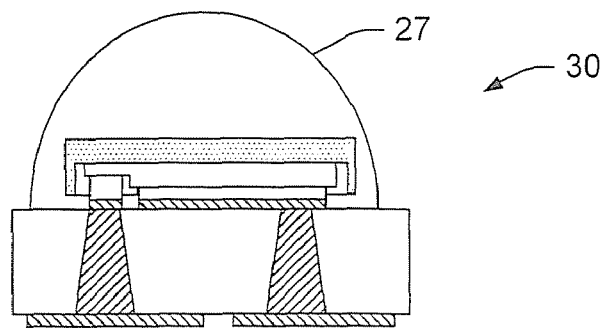

Diodes 16 may be coated, using electrophoretic deposition for example, with an optional wavelength conversion layer 25 as shown in FIG. 5H, and may be covered with a drop of transparent resin encapsulant 27 as shown in FIG. 5I which may provide environmental and mechanical protection to the chip while also acting as a lens. The individual packaged devices 30 may then be separated, for example by dicing the carrier substrate 20. In some embodiments, the wavelength conversion layer 25 may extend over portions of the surface of the carrier substrate.

Figure 6:
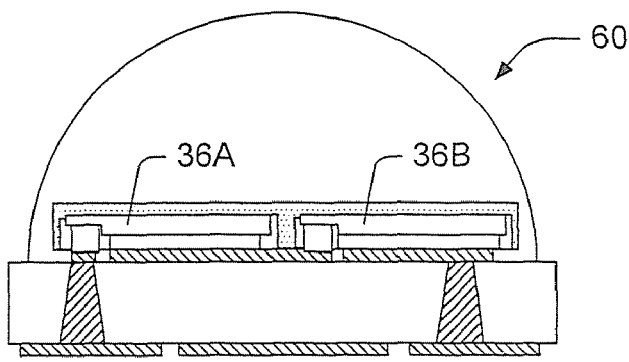
FIG. 6 is a cross-sectional drawing illustrating further embodiments of the invention.

FIG. 6 illustrates embodiments of the invention in which multiple diodes 36A, 36B are provided within a single packaged device 60. The diodes 36A, 36B may be interconnected in serial or parallel fashion using the techniques described above. Alternatively, the diodes may be electrically isolated from each other. Again, since all interconnection may be performed at the wafer level, the processing steps and cost required to fabricate the packaged device may be reduced. Accordingly, device redundancy may be built-in, improving reliability of the device.

Figure 7:
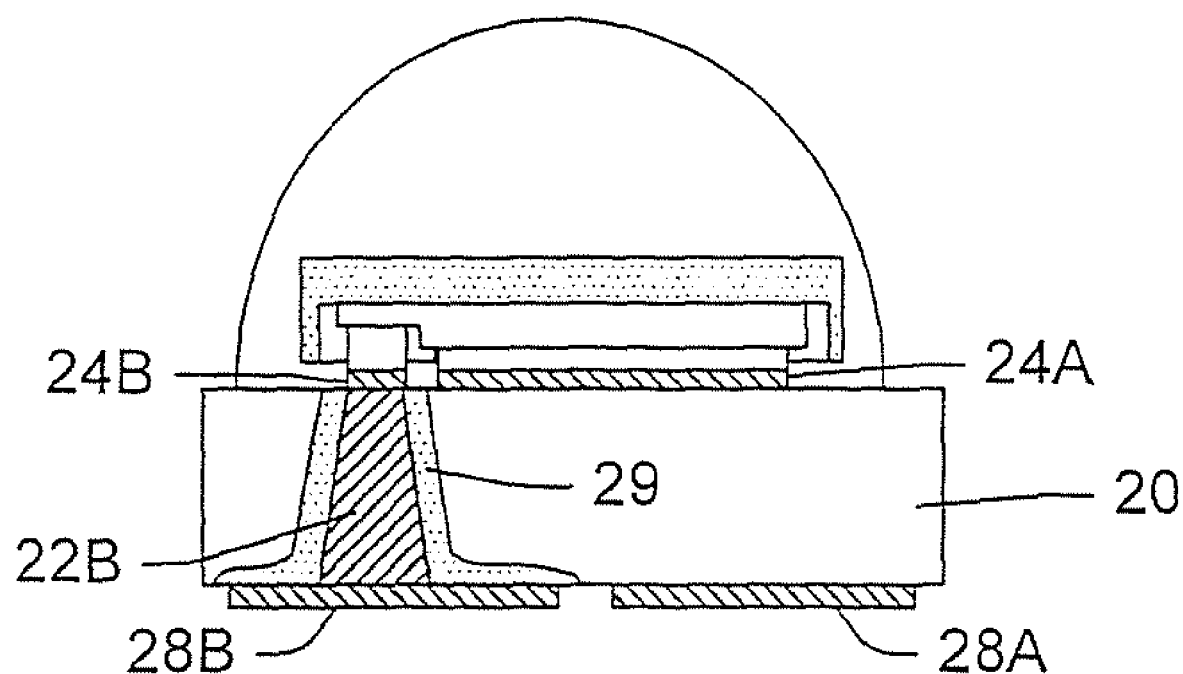
FIG. 7 is a cross-sectional drawing illustrating further embodiments of the invention.

FIG. 7 illustrates embodiments of the invention in which the carrier substrate 20 is made from a conductor or a semiconductor material (e.g. Si, SiC), and which may thereby serve to provide an electrical connection between, for instance, the bond pad 24A and the backside trace 28A. Consequently, the formation of a via connecting the bond pad 24A and the backside trace 28A may not be necessary for providing an electrical connection (although a via may nevertheless be formed to improve thermal conductivity as described above). In these embodiments, a barrier 29 may be formed between the via 22B, bond pad 24B, and/or backside trace 28B and the conducting substrate 20 in order provide electrical isolation. The barrier 29 may include a thin insulator layer (e.g. SiN) deposited on the substrate after the formation of the via. Alternatively, it may be provided through the formation of a current blocking semiconductor junction (by dopant diffusion, for example) prior to the filling of the via and formation of the bond pad and backside trace. Other methods for forming the barrier 29 will be readily apparent to those of ordinary skill in the art. A current blocking semiconductor junction may also act as a Zener diode for electrostatic discharge protection, as described in more detail in U.S. patent application Ser. No. 10/987,894 filed Nov. 12, 2004, entitled "Semiconductor Light Emitting Devices and Submounts and Methods for Forming the Same," the disclosure of which is incorporated herein by reference as if fully set forth.

It will be understood by those of ordinary skill in the art, that the various elements described above and illustrated in the figures may be combined separately or together in many different configurations. It will also be understood that the precise order of fabrication steps may vary from that shown. Embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor structure, comprising:
    a carrier substrate having a top surface and a bottom surface;
    a wafer including a plurality of light emitting diodes thereon, wherein the light emitting diodes on the wafer are bonded to the top surface of the carrier substrate between the wafer and the carrier substrate, each of the light emitting diodes having first and second electrodes; and
    a plurality of pairs of first and second conductive vias extending from the top surface of the carrier substrate to the bottom surface of the carrier substrate, wherein at least one via of each pair of conductive vias is electrically connected to the first electrode of a light emitting diode of the plurality of light emitting diodes.

2. The semiconductor structure of claim 1, further comprising:
    a plurality of bond pads disposed between the top surface of the carrier substrate and the plurality of light emitting diodes, wherein at least one of the plurality of light emitting diodes is mounted on one of the plurality of bond pads.

3. The semiconductor structure of claim 1, further comprising:
    a plurality of bond pads on the bottom surface of the carrier substrate, wherein each of the plurality of bond pads on the bottom surface of the carrier substrate is in electrical contact with at least one of the first or second conductive vias.

4. The semiconductor structure of claim 1, wherein respective ones of the first and second conductive vias are isolated from others of the first and second conductive vias.

5. The semiconductor structure of claim 1, wherein the wafer comprises an epiwafer and the light emitting diodes comprise epitaxial growth layers on the epiwafer.

6. The semiconductor structure of claim 1, wherein the first and second electrodes comprise metal electrodes.

7. A packaged light emitting device, comprising:
   a carrier substrate having a top surface and a bottom surface;
   first and second conductive vias extending from the top surface of the substrate to the bottom surface of the substrate;
   a bond pad on the top surface of the substrate and in electrical contact with the first conductive via;
   a diode having first and second electrodes on opposite sides of the diode, wherein the diode is mounted on the bond pad, and wherein the first electrode is in electrical contact with the bond pad;
   a passivation layer on the top surface of the carrier substrate and in contact with at least one sidewall of the diode;
   a conductive trace on the top surface of the carrier substrate, wherein the conductive trace is on the passivation layer and electrically connects the second conductive via and the second electrode;
   a reflective layer on the top surface of the carrier substrate, the reflective layer surrounding the diode and defining a cavity above the diode, wherein the reflective layer is at least partially on the passivation layer; and
   an encapsulant material in the cavity.

8. The packaged light emitting device of claim 7, further comprising a transparent sealing layer on the reflective layer above the diode, wherein the sealing layer forms a hermetic seal to the reflective layer.

* * * * *